(12) United States Patent
Hara

(10) Patent No.: US 10,916,304 B2
(45) Date of Patent: Feb. 9, 2021

(54) SEMICONDUCTOR STORAGE DEVICE HAVING ALTERNATELY STACKED BIT LINES AND WORD LINES, AND FIRST AND SECOND CONNECTION WIRINGS TO BIT LINE CONTACTS, THAT EXTEND IN OPPOSITE DIRECTIONS WITH RESPECT THERETO

(71) Applicant: Toshiba Memory Corporation, Tokyo (JP)

(72) Inventor: Hiroyuki Hara, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/285,121

(22) Filed: Feb. 25, 2019

(65) Prior Publication Data

US 2020/0090744 A1    Mar. 19, 2020

(30) Foreign Application Priority Data

Sep. 19, 2018    (JP) ................................ 2018-174787

(51) Int. Cl.
     *G11C 5/06*      (2006.01)
     *G11C 13/00*      (2006.01)
     *H01L 27/24*      (2006.01)

(52) U.S. Cl.
     CPC ........ *G11C 13/003* (2013.01); *H01L 27/2463* (2013.01); *G11C 2213/79* (2013.01)

(58) Field of Classification Search
     CPC ........... G11C 13/003; G11C 8/14; G11C 5/06; G11C 5/02; G11C 5/025; G11C 7/18

USPC ......................................................... 365/148
See application file for complete search history.

(56) References Cited

U.S. PATENT DOCUMENTS

2011/0242875 A1    10/2011   Nagashima et al.
2012/0049148 A1*    3/2012   Fukano ............... H01L 27/2463
                                                                                                                                                                   257/5

FOREIGN PATENT DOCUMENTS

JP           2010044827 A      2/2010

\* cited by examiner

*Primary Examiner* — Alfredo Bermudez Lozada
(74) *Attorney, Agent, or Firm* — Kim & Stewart LLP

(57) ABSTRACT

A semiconductor storage device includes first, second, and third wiring layers, each including a plurality of first wirings, fourth and fifth wiring layers, each including a plurality of second wirings, wherein the fourth wiring layer is between the first and second wiring layers and the fifth wiring layer is between the second and third wiring layers, memory cells formed at intersections of the first and second wirings of adjacent wiring layers, first and second contacts electrically connected to a first wiring of the first wiring layer and a first wiring of the second wiring layer, respectively, in the hook-up region, a sixth wiring layer including a first connection wiring electrically connected to the first contact and a second connection wiring electrically connected to the second contact and separated from the first connection wiring, and first and second drive circuits electrically connected to the first and second connection wirings, respectively.

17 Claims, 7 Drawing Sheets

SEMICONDUCTOR STORAGE DEVICE HAVING ALTERNATELY STACKED BIT LINES AND WORD LINES, AND FIRST AND SECOND CONNECTION WIRINGS TO BIT LINE CONTACTS, THAT EXTEND IN OPPOSITE DIRECTIONS WITH RESPECT THERETO

CROSS-REFERENCE TO RELATED APPLICATION

This application is based upon and claims the benefit of priority from Japanese Patent Application No. 2018-174787, filed Sep. 19, 2018, the entire contents of which are incorporated herein by reference.

FIELD

Embodiments described herein relate generally to semiconductor storage devices.

BACKGROUND

As an example of a semiconductor storage device, a cross point semiconductor memory in which a bit line and a word line are alternately stacked is known. In such a semiconductor memory, a wiring layer is provided for electrically connecting memory cells to drive circuits such as selection circuits and non-selection circuits.

DETAILED DESCRIPTION

Embodiments provide a semiconductor storage device capable of reducing the number of wiring layers for electrically connecting memory cells to drive circuits.

In general, according to an embodiment, a semiconductor storage device includes first, second, and third wiring layers, each including a plurality of first wirings extending in a first direction and arranged side by side in a second direction perpendicular to the first direction, fourth and fifth wiring layers, each including a plurality of second wirings extending in the second direction and arranged side by side in the first direction, wherein the fourth wiring layer is between the first and second wiring layers and the fifth wiring layer is between the second and third wiring layers, a memory cell array having a plurality of memory cells formed at intersections of the first and second wirings of adjacent wiring layers, a first contact electrically connected to a first wiring of the first wiring layer, in a hook-up region, a second contact electrically connected to a first wiring of the second wiring layer, in the hook-up region, a sixth wiring layer including a first connection wiring electrically connected to the first contact and a second connection wiring electrically connected to the second contact and separated from the first connection wiring, a first drive circuit electrically connected to the first connection wiring, and a second drive circuit electrically connected to the second connection wiring.

Hereinafter, embodiments of the present disclosure will be described with reference to the drawings. The present disclosure is not limited by embodiments described below.

First Embodiment

Figure 1:
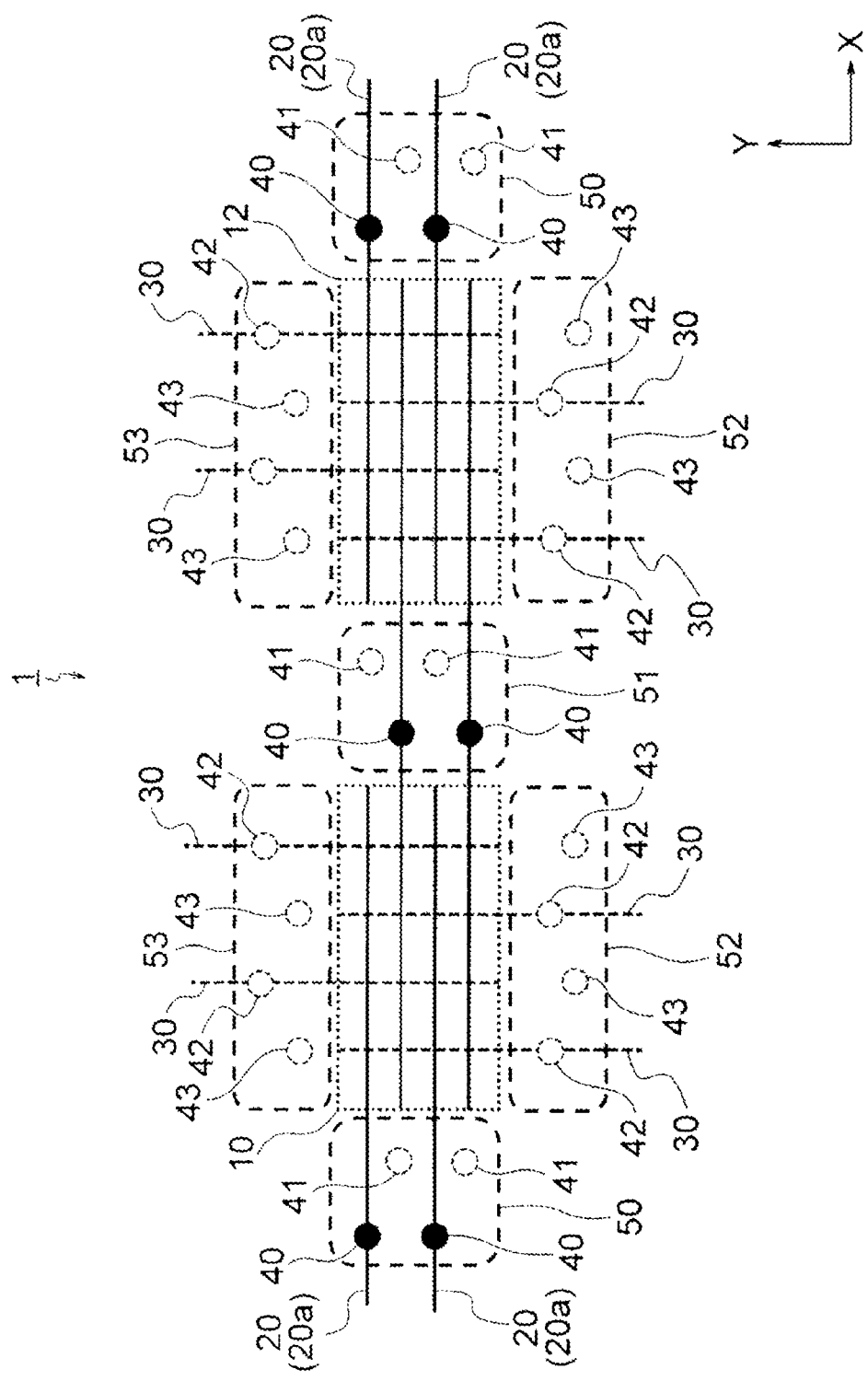
FIG. 1 illustrates a schematic plan view of a semiconductor storage device according to a first embodiment.
Figure 2:
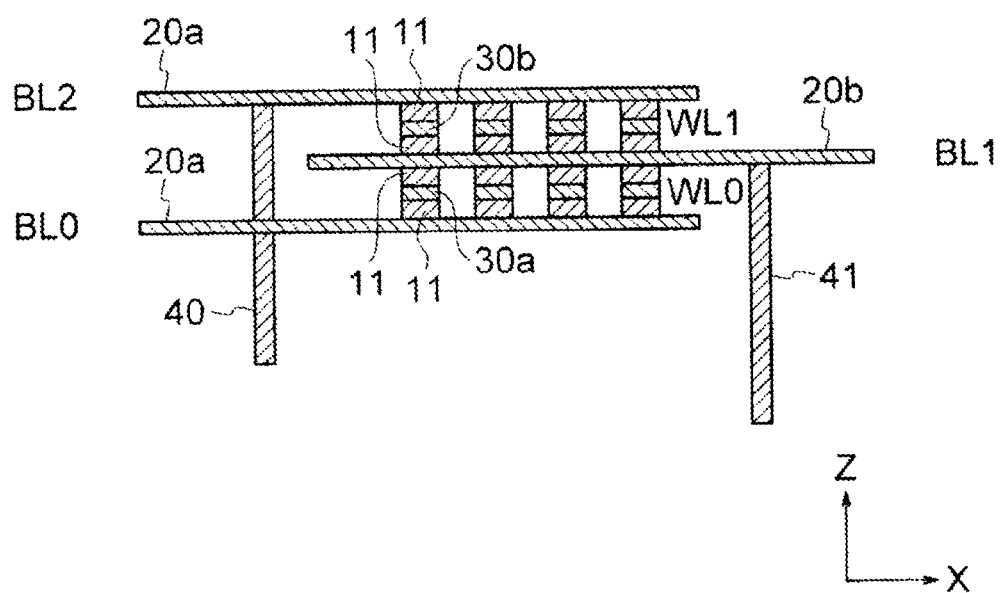
FIG. 2 illustrates a schematic cross-sectional view of a part of the semiconductor storage device according to the first embodiment.

FIG. 1 illustrates a schematic plan view of a semiconductor storage device according to a first embodiment. FIG. 2 illustrates a schematic cross-sectional view of a part of the semiconductor storage device according to the first embodiment. A semiconductor storage device 1 according to the present embodiment is a cross point semiconductor memory in which a bit line and a word line are alternately stacked.

A cell array 10 is provided in the semiconductor storage device 1. The cell array 10, as shown in FIG. 2, has a plurality of memory cells 11. Each of the memory cells 11 is formed at an intersection portion of a cell wiring 20 and a cell wiring 30.

The cell wiring 20 functions as a bit line extending in an X direction. Meanwhile, the cell wiring 30 functions as a word line extending in a Y direction perpendicular to the X direction. In the present embodiment, the cell wiring 20 corresponds to the first cell wiring and the cell wiring 30 corresponds to the second cell wiring. However, the cell wiring 20 may correspond to the second cell wiring while the cell wiring 30 may correspond to the first cell wiring.

The cell wiring 20 and the cell wiring 30 are alternately stacked in a Z direction perpendicular to the X direction and the Y direction. In the semiconductor storage device 1, a plurality of cell wirings 20 are arrayed in the Y direction in each of three cell wiring layers: BL0, BL1, and BL2. In addition, a plurality of cell wirings 30 are arrayed in the X direction in each of two cell wiring layers: WL0 and WL1. The number of cell wirings formed in each cell wiring layer and the number of cell wiring layers are not particularly limited.

Among the plurality of cell wirings 20, cell wirings 20a provided in odd-numbered cell wiring layers BL0 and BL2 are electrically connected with contacts 40 in hook-up regions 50 and hook-up regions 51, as shown in FIG. 1. The hook-up region 50 is provided outside the cell array 10 in the X direction. The hook-up region 51 is provided on the opposite side of the cell array 10 from the hook-up region 50.

In addition, a cell wiring 20b provided in an even-numbered cell wiring layer BL1 is electrically connected to contacts 41 in the hook-up regions 50 and the hook-up regions 51. In each hook-up region, the contacts 40 and the contacts 41 are alternately arranged.

Meanwhile, among the plurality of cell wirings 30, a cell wiring 30a provided in an odd-numbered cell wiring layer WL0 is connected to contacts 42 in hook-up regions 52 and hook-up regions 53, as shown in FIG. 1. The hook-up region 52 is provided outside the cell array 10 in the Y direction. The hook-up region 53 is provided on the opposite side of the cell array 10 from the hook-up region 52.

In addition, a cell wiring 30b provided in an even-numbered cell wiring layer WL1 is electrically connected to contacts 43 in the hook-up regions 52 and the hook-up regions 53. In each hook-up region, the contacts 42 and the contacts 43 are alternately arranged.

Figure 3:
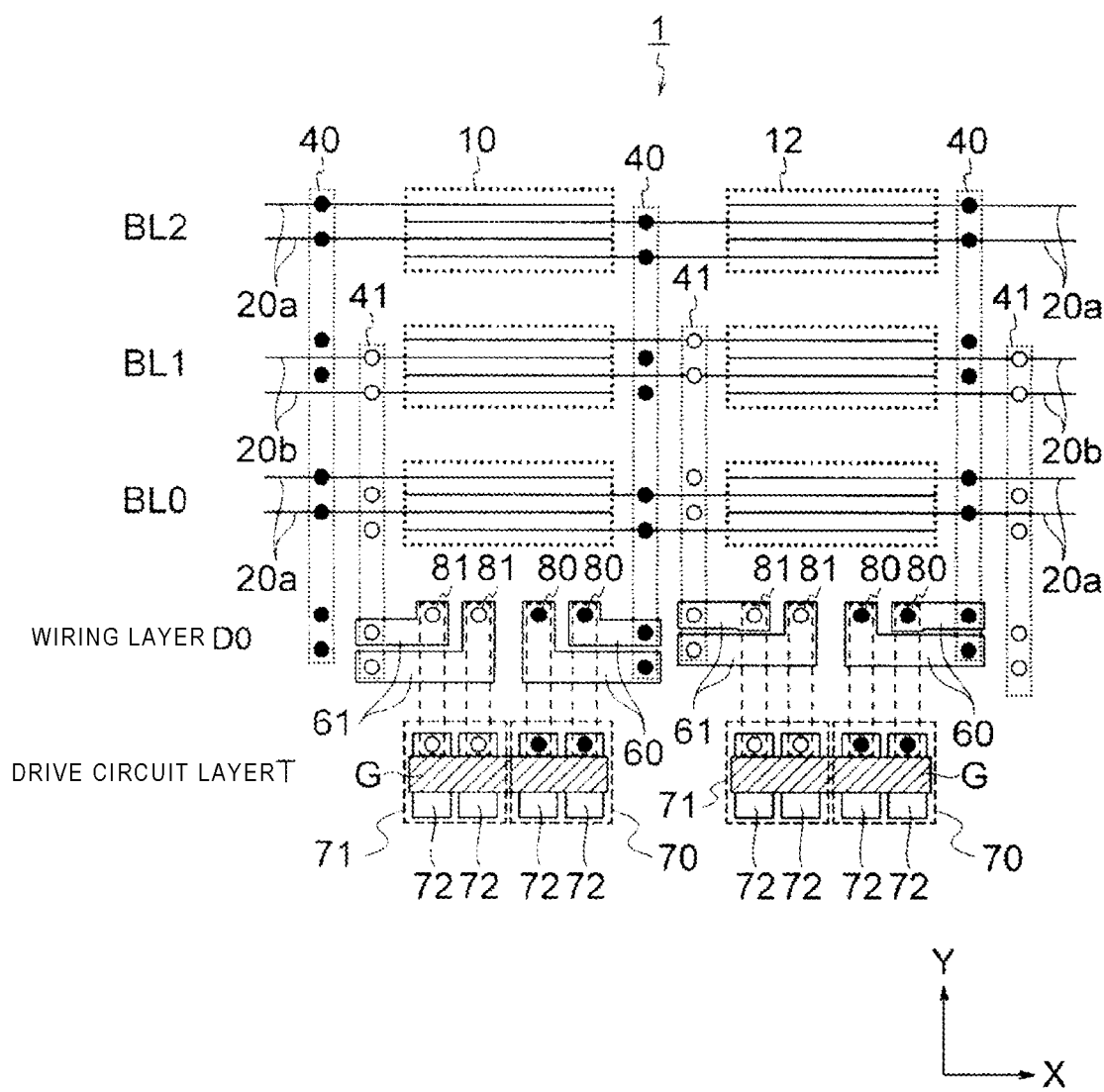
FIG. 3 illustrates a plan view of the semiconductor storage device according to the first embodiment in a layered manner.

FIG. 3 illustrates a plan view of the semiconductor storage device 1 according to the first embodiment in a layered manner. Specifically, FIG. 3 shows an XY plane of a layer where the cell wiring layer BL2 is provided, an XY plane of a layer where the cell wiring layer BL1 is wired, an XY plane of a layer where the cell wiring layer BL0 is wired, an XY plane of a layer where the wiring layer D0 is wired, and an XY plane of a layer where a drive circuit layer T is wired, in a vertically aligned manner. In FIG. 3, only the layers electrically connected to the cell wirings 20 are shown and the layers electrically connected to the cell wirings 30 are omitted.

As shown in FIG. 3, the wiring layer D0 is provided below the cell wiring layer BL0 in a direction of a Z-axis. In the wiring layer D0, connection wirings 60 and connection wirings 61 are provided separately from each other in the X direction. In addition, the connection wirings 60 and the connection wirings 61 extend in the direction of the X axis. The connection wirings 60 are electrically connected to the odd-numbered cell wiring layers BL0 and BL2. One ends of the connection wirings 60 are electrically connected to the contacts 40 provided in the hook-up region 51 on the right side of the cell array 10. The contacts 40 are shared by the cell wiring layer BL0 and the cell wiring layer BL2. The other ends of the connection wirings 60 are wired below the cell array 10. The connection wirings 61 are electrically connected to the even-numbered cell wiring layer BL1. One ends of the connection wirings 61 are electrically connected to the contacts 41 provided in the hook-up region 50 on the left side of the cell array 10. The other ends of the connection wirings 61 are wired below the cell array 10. In addition, the one ends of the connection wirings 61 may also be electrically connected to the contacts 41 provided in the hook-up region 51 on the right side of the cell array 10, and the other ends may be arranged below an adjacent cell array 12 in the X direction. FIG. 3 shows an example in which: the wirings in the even-numbered cell wiring layer BL1 in the Y direction extend from the hook-up region 50 on the left side of the cell array 10 to a region below the cell array 10; and the wirings in the odd-numbered cell wiring layer BL1 in the Y direction extend from the hook-up region 51 on the right side of the cell array 10 to a region below the adjacent cell array 12.

The drive circuit layer T is provided below the wiring layer D0. Drive circuits 70 and drive circuits 71 are provided in the drive circuit layer T. Each drive circuit includes a plurality of transistors 72 sharing a gate G. Drains of the transistors provided in the drive circuits 70 are connected to the other ends of the connection wirings 60 through transistor wirings 80. Drains of the transistors provided in the drive circuits 71 are connected to the other ends of the connection wirings 61 through transistor wirings 81. The transistors 72 function as selection transistors or non-selection transistors of the memory cells 11. The selection transistor applies a voltage for writing or reading to a cell wiring connected to a memory cell which is a target of writing or reading, and the non-selection transistor applies a voltage for non-selection to a cell wiring connected to a memory cell which is not the target of writing or reading.

Figure 4:
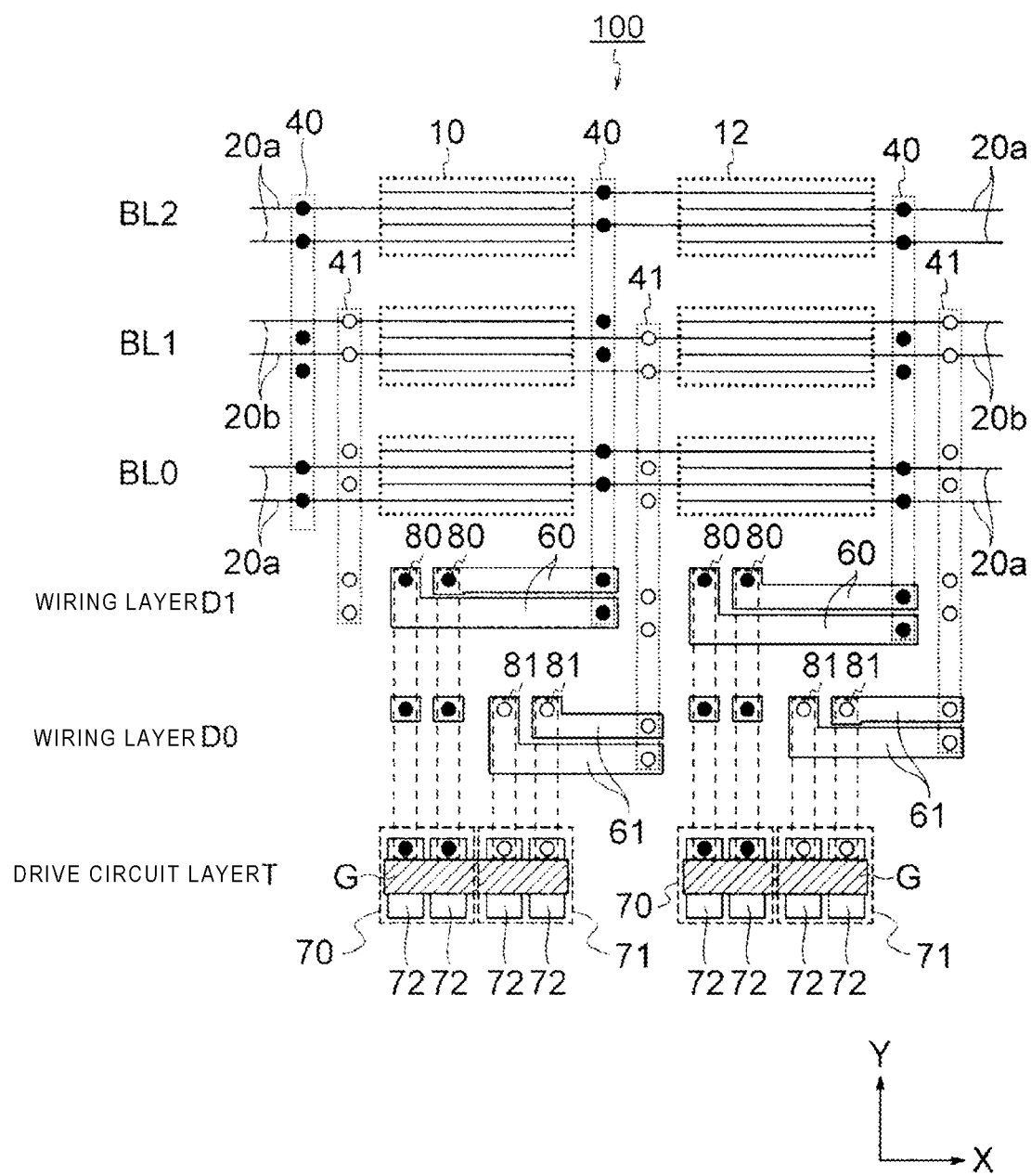
FIG. 4 illustrates a plan view of a semiconductor storage device according to a first comparative example in a layered manner.

FIG. 4 illustrates a plan view of a semiconductor storage device 100 according to a first comparative example in a layered manner. Constituent elements similar to those of the semiconductor storage device 1 according to the above-described first embodiment are attached with the same reference numerals, and detailed description thereof will be omitted.

In the semiconductor storage device 100 shown in FIG. 4, a wiring layer D1 is provided in addition to the wiring layer D0. The wiring layer D1 includes the connection wirings 60. The connection wirings 60 are electrically connected to the contacts 40 provided in the hook-up region 51 on the right side of the cell array 10.

Meanwhile, the wiring layer D0 includes the connection wirings 61. The connection wirings 61 are electrically connected to the contacts 41 provided in the hook-up region 51 on the right side of the cell array 10.

In the semiconductor storage device 100 according to this comparative example, the connection wirings 60 and the connection wirings 61 are separately provided in the different wiring layers D0 and D1. Therefore, two wiring layers are required in order to electrically connect the memory cells 11 to the drive circuits 70 and 71.

To the contrary, in the semiconductor storage device shown in FIG. 3, the connection wirings 60 and the connection wirings 61 are provided in the same wiring layer D0. That is, the connection wirings 60 and the connection wirings 61 share the wiring layer D0. Therefore, in the semiconductor storage device 1 of the present embodiment, the number of wiring layers for electrically connecting the memory cells 11 to the drive circuits 70 and 71 can be reduced to half the number of wiring layers of the semiconductor storage device 100.

Figure 5A:
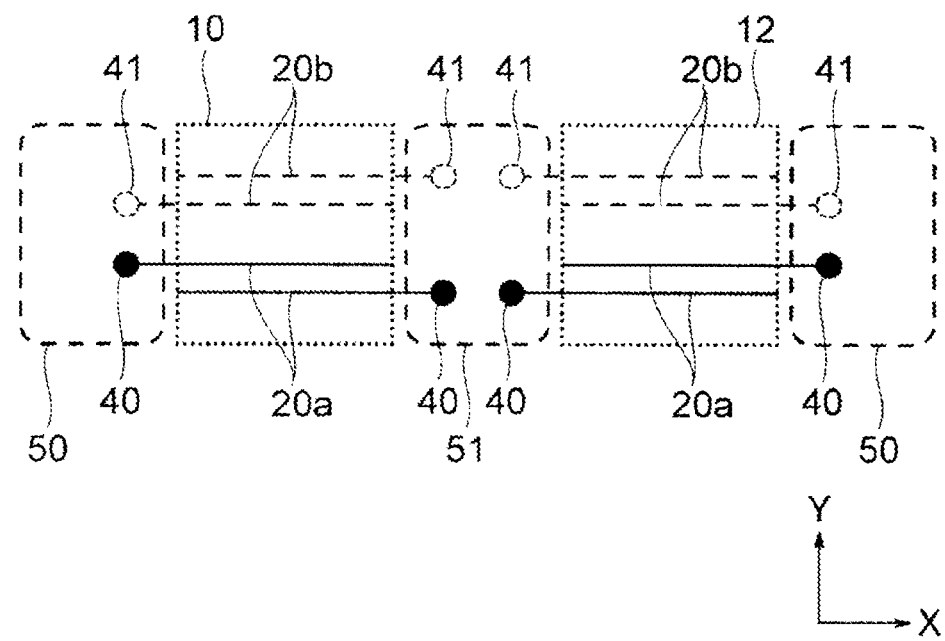
FIG. 5A illustrates a plan view of another layout of contacts.
Figure 5B:
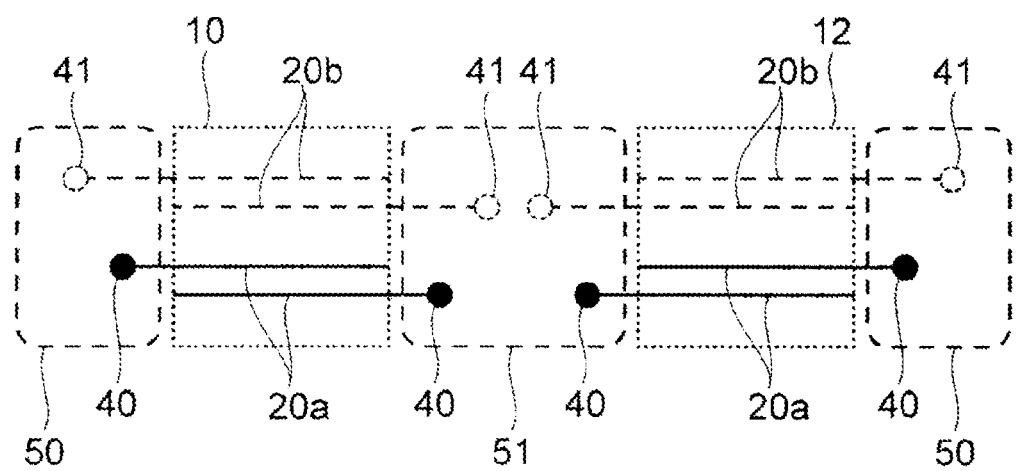
FIG. 5B illustrates a plan view of still another layout of contacts.

FIG. 5A illustrates a plan view of another layout of contacts. FIG. 5B illustrates a plan view of still another layout of contacts.

In FIG. 5A, the contacts 40 connected to the cell wirings 20a arranged side by side in the Y direction are alternately arranged in the hook-up regions 50 and the hook-up regions 51. In addition, the contacts 41 connected to the cell wirings 20b arranged side by side in the Y direction are alternately arranged in the hook-up regions 50 and the hook-up regions 51. In addition, in the hook-up regions 50 and the hook-up regions 51, the contacts 40 and the contacts 41 are arranged opposite to each other in the Y direction.

In FIG. 5B, the contacts 40 connected to the cell wirings 20a arranged side by side in the Y direction are alternately arranged in the hook-up regions 50 and the hook-up regions 51. In addition, the contacts 41 connected to the cell wirings 20b arranged side by side in the Y direction are alternately arranged in the hook-up regions 50 and the hook-up regions 51. Meanwhile, in the hook-up regions 50 and the hook-up regions 51, the contacts 40 and the contacts 41 are arranged in a shifted manner in the X direction.

Even when the contacts 40 and the contacts 41 are arranged as in the layout shown in FIG. 5A or FIG. 5B, the connection wirings 60 and 61 connected to respective contacts can be drawn to regions below the cell array 10, or below both the cell array 10 and the cell array 12, and can be formed in the same wiring layer. Therefore, the number of wiring layers can be reduced.

Second Embodiment

Figure 6:
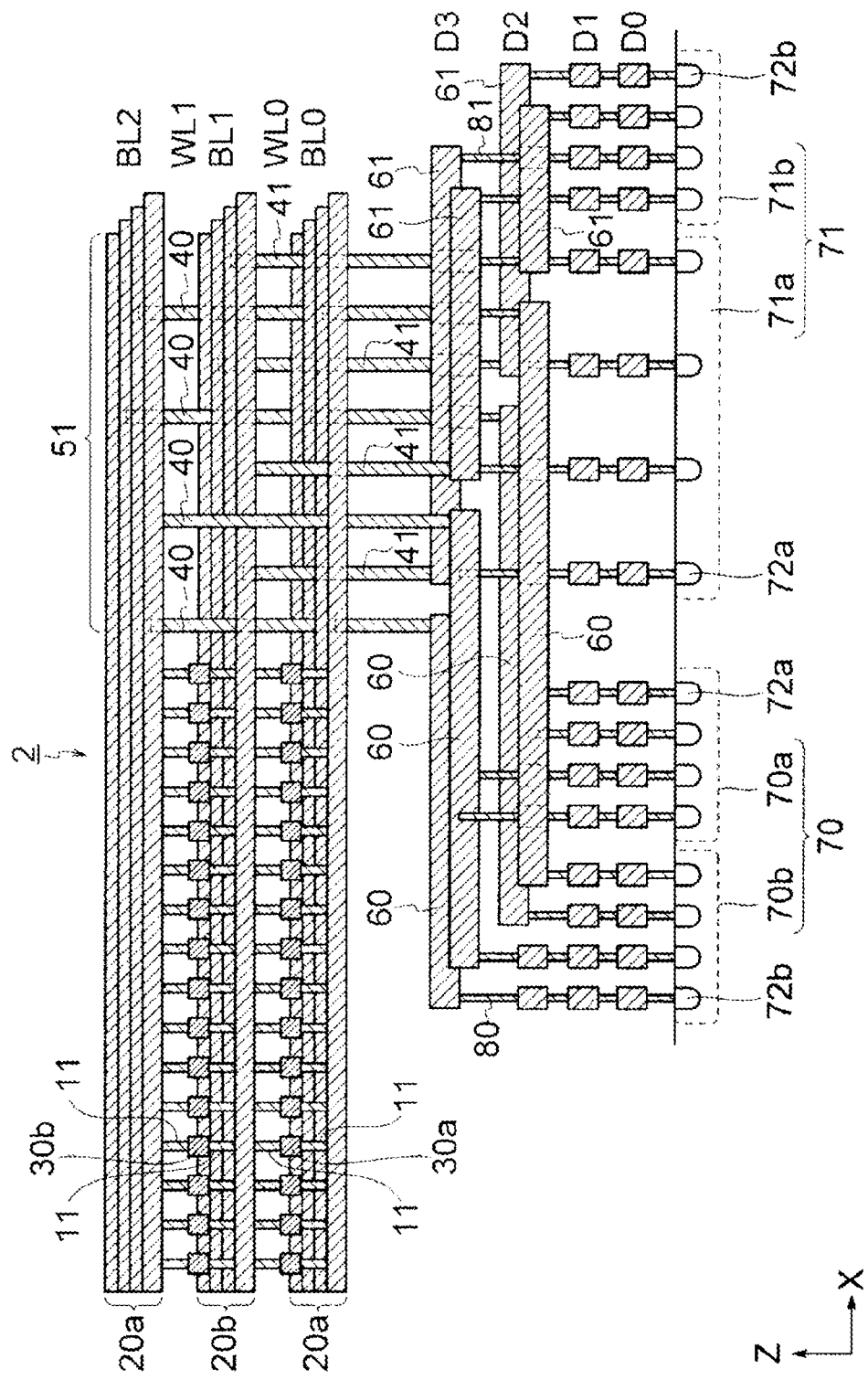
FIG. 6 is a diagram schematically illustrating a cross-sectional structure of a semiconductor storage device according to a second embodiment.

FIG. 6 is a diagram schematically illustrating a cross-sectional structure of a semiconductor storage device according to a second embodiment. Elements similar to those of the semiconductor storage device 1 according to the above-described first embodiment are attached with the same reference numerals, and detailed description thereof will be omitted.

Four wiring layers D0 to D3 are provided in a semiconductor storage device 2 shown in FIG. 6. Each wiring layer includes connection wirings 60 and connection wirings 61. The connection wirings 60 are connected to contacts 40 provided in a hook-up region 51. The connection wirings 61 are connected to contacts 41 provided in the same hook-up region 51 as the contacts 40. The contacts 40 are commonly connected to a plurality of cell wirings 20a of odd-numbered layers, and the contacts 41 are connected to cell wirings 20b of an even-numbered layer.

In addition, the connection wirings 60 are electrically connected to drive circuits 70 through transistor wirings 80, and the connection wirings 61 are electrically connected to drive circuits 71 through transistor wirings 81.

The drive circuits 70 are disposed in a region where memory cells 11 are provided, that is, in a region below a cell array 10. The drive circuits 70 include a selection circuit 70a and a non-selection circuit 70b. The selection circuit 70a includes a plurality of selection transistors 72a, and the non-selection circuit 70b has a plurality of non-selection transistors 72b. Each selection transistor 72a is energized when a memory cell 11 of an odd-numbered layer is selected. Each non-selection transistor 72b is energized when memory cells 11 of odd-numbered layers are not selected.

In the present embodiment, the selection circuit 70a is disposed closer to the contacts 40 than the non-selection circuit 70b. In other words, a wiring length between each contact 40 and the selection circuit 70a is shorter than that between each contact 40 and the non-selection circuit 70b. In addition, an input current of the selection transistor 72a is larger than that of the non-selection transistor 72b. Therefore, since the selection circuit 70a and the non-selection circuit 70b are arranged as described above, electric resistance of a current path to the selection transistor 72a, through which a relatively large current flows, can be reduced.

The drive circuits 71 include a selection circuit 71a and a non-selection circuit 71b. Similarly to the selection circuit 70a and the non-selection circuit 70b, the selection circuit 71a and the non-selection circuit 71b have a plurality of selection transistors 72a and a plurality of non-selection transistors 72b, respectively.

In the present embodiment, the selection circuit 71a is disposed in the hook-up region 51, and the non-selection circuit 71b is disposed outside the hook-up region 51. Accordingly, the selection circuit 71a is disposed closer to the contacts 41 than the non-selection circuit 71b.

As a result, electric resistance of a current path to the selection transistor 72a, through which a relatively large current flows, can be reduced.

Figure 7:
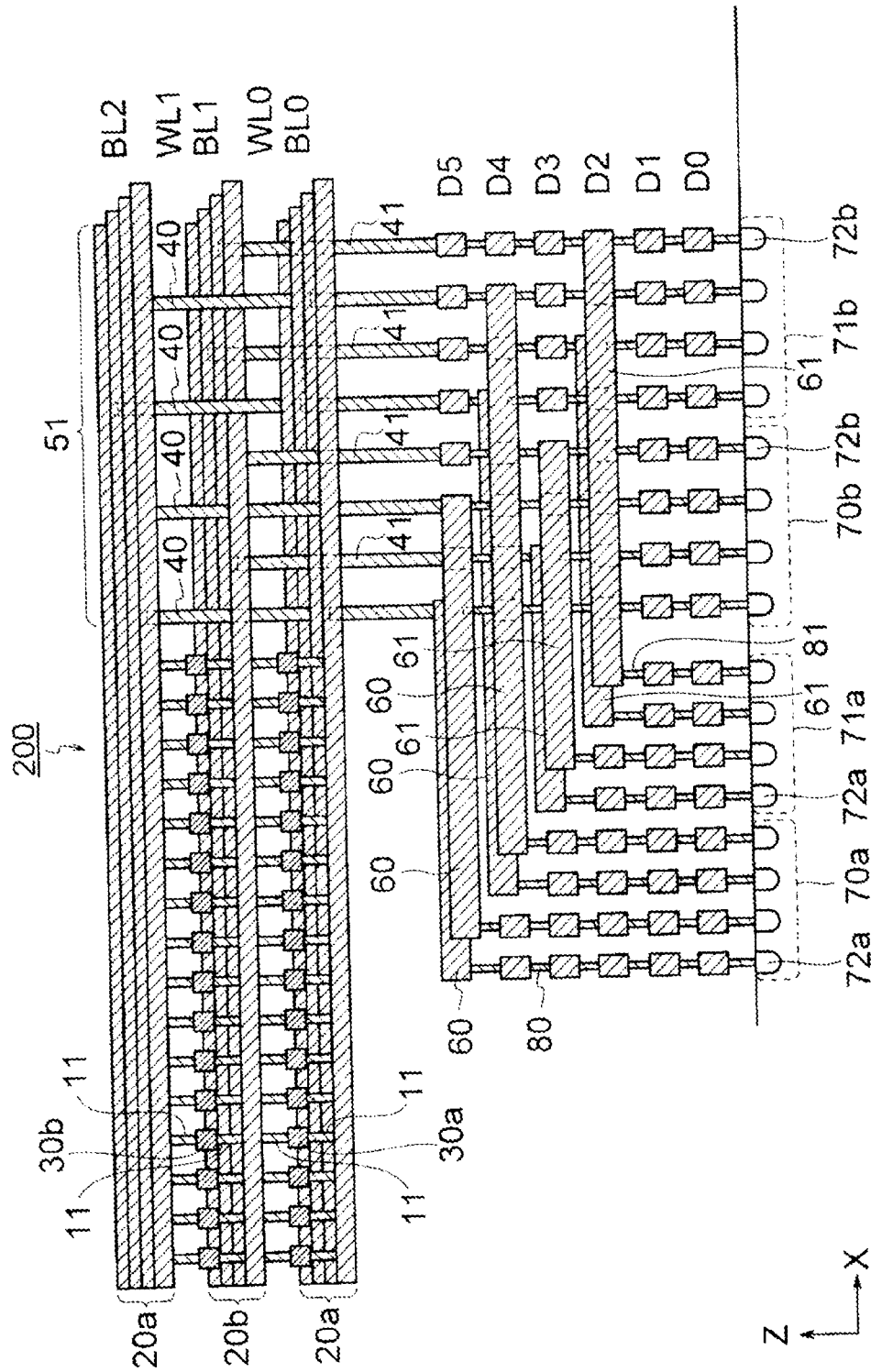
FIG. 7 is a diagram schematically illustrating a cross-sectional structure of a semiconductor storage device according to a second comparative example.

FIG. 7 is a diagram schematically illustrating a cross-sectional structure of a semiconductor storage device 200 according to a second comparative example.

Elements similar to those of the semiconductor storage device 2 according to the above-described second embodiment are attached with the same reference numerals, and detailed description thereof will be omitted.

In the semiconductor storage device 200 shown in FIG. 7, a wiring layer D4 and a wiring layer D5 are provided in addition to the wiring layers D0 to D3. The wiring layer D2 and the wiring layer D3 include the connection wirings 61.

In addition, the wiring layer D4 and the wiring layer D5 include the connection wirings 60.

Further, in the semiconductor storage device 200, the selection circuit 70a and the selection circuit 71a are disposed in a region where the memory cells 11 are provided, that is, in the region below the cell array 10. The non-selection circuit 70b and the non-selection circuit 71b are disposed in the hook-up region 51.

In the semiconductor storage device 200 according to the present comparative example, the connection wirings 60 and the connection wirings 61 are separately provided in different wiring layers. Therefore, the four wiring layers are required in order to electrically connect the memory cells 11 to the drive circuits 70 and 71. In addition, in the semiconductor storage device 200, the selection circuits 70a and 71a are farther from the contacts 40 and 41 than the non-selection circuits 70b and 71b.

To the contrary, in the semiconductor storage device shown in FIG. 6, the connection wirings 60 and the connection wirings 61 are provided in the same wiring layer. That is, the connection wirings 60 and the connection wirings 61 share the same wiring layer. Therefore, in the semiconductor storage device 2 of the present embodiment, the number of wiring layers for electrically connecting the memory cells 11 with the drive circuits 70 and 71 can be reduced.

In addition, in the present embodiment, by providing the selection circuits 70a and 71a near the contacts 40 and 41, electric resistance of a current path to the selection transistor 72a, through which a relatively large current flows, can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor storage device, comprising:
   a plurality of first wirings extending in a first direction and arranged side by side in a second direction perpendicular to the first direction;
   a plurality of second wirings extending in the second direction and arranged side by side in the first direction, and disposed above the first wirings in a third direction perpendicular to the first direction and the second direction;
   a first memory cell array having a plurality of first memory cells formed at intersections of the first wirings and the second wirings;
   a plurality of third wirings extending in the first direction and arranged side by side in the second direction, and disposed above the second wirings in the third direction;
   a second memory cell array having a plurality of second memory cells formed at intersections of the second wirings and the third wirings;
   a plurality of fourth wirings extending in the second direction and arranged side by side in the first direction, and disposed above the third wirings in the third direction;

a third memory cell array having a plurality of third memory cells formed at intersections of the third wirings and the fourth wirings;
a plurality of fifth wirings extending in the first direction and arranged side by side in the second direction, and disposed above the fourth wirings in the third direction;
a fourth memory cell array having a plurality of fourth memory cells formed at intersections of the fourth wirings and the fifth wirings;
a plurality of first contacts extending in the third direction and electrically connected to the first and the fifth wirings, respectively, in a hook-up region;
a plurality of second contacts extending in the third direction and electrically connected to the third wirings, in the hook-up region;
a plurality of first connection wirings and a plurality of second connection wirings, wherein the first connection wirings are electrically connected to the first contacts, respectively, and the second connection wirings are electrically connected to the second contacts, respectively, and separated from the first connection wirings, respectively, and wherein the first connection wirings have first ends connected to the first contacts and second ends that extend away from the first ends thereof in a first extension direction, and the second connection wirings have first ends connected to the second contacts and second ends that extend away from the first ends thereof in a second extension direction that is opposite to the first extension direction;
a first drive circuit region including a plurality of first drive circuits electrically connected to the first connection wirings, respectively; and
a second drive circuit region including a plurality of second drive circuits electrically connected to the second connection wirings, respectively.

2. The semiconductor storage device according to claim 1, wherein
the first contacts are electrically connected to the first ends of the first connection wirings, respectively, and the first drive circuits are electrically connected to the second ends of the first connection wirings, respectively, and
the second contacts are electrically connected to the first ends of the second connection wirings, respectively, and the second drive circuits are electrically connected to the second ends of the second connection wirings, respectively.

3. The semiconductor storage device according to claim 2, wherein
the first end of one of the first connection wirings and the first end of one of the second connection wirings are positioned between the second end of said one of the first connection wirings and the second end of said one of the second connection wirings, in the first direction.

4. The semiconductor storage device according to claim 3, wherein
each of the first drive circuit regions includes:
a first selection circuit configured to energize a corresponding one of the first wirings and a corresponding one of the fifth wirings to select a corresponding one of the first memory cells or a corresponding one of the fourth memory cells, and
a first non-selection circuit configured to energize at least another one of the first wirings and at least another one of the fifth wirings, each of the second drive circuit regions includes:
a second selection circuit configured to energize a corresponding one of the third wirings to select a corresponding one of the second memory cells or a corresponding one of the third memory cells, and
a second non-selection circuit configured to energize at least another one of the third wirings,
the first selection circuit is disposed closer to the first contacts than the first non-selection circuit, and
the second selection circuit is disposed closer to the second contacts than the second non-selection circuit.

5. The semiconductor storage device according to claim 4, wherein
the hook-up region includes a first hook-up region and a second hook-up region respectively located on opposite sides of the first to fourth memory cell arrays,
the first connection wirings are electrically connected to the first contacts in the first hook-up region, and
the second connection wirings are electrically connected to the second contacts in the first hook-up region.

6. The semiconductor storage device according to claim 4, wherein the first non-selection circuit, the first selection circuit, the second selection circuit, and the second non-selection circuit are arranged in this order along the first direction.

7. The semiconductor storage device according to claim 4, further comprising:
fifth to eighth memory cell arrays disposed apart from the first to fourth memory cell arrays in the first direction, wherein
the first non-selection circuit is disposed below the first to fourth memory cell arrays,
the second non-selection circuit is disposed below the fifth to eighth memory cell arrays, and
the first selection circuit and the second selection circuit are provided between the first non-selection circuit and the second non-selection circuit in the first direction.

8. The semiconductor storage device according to claim 1, wherein
a first group of the first connection wirings is provided in a first metal layer below the first wirings in the third direction, and a second group of the first connection wirings is provided in a second metal layer below the first metal layer in the third direction, and
a first group of the second connection wirings is provided in the first metal layer, and a second group of the second connection wirings is provided in the second metal layer.

9. The semiconductor storage device according to claim 1, wherein the first, the third and the fifth wirings are bit lines, and the second and fourth wirings are word lines.

10. A semiconductor storage device of a cross-point type, comprising:
a plurality of first bit line wirings, a plurality of word line wirings, and a plurality of second bit line wirings, that are stacked in a first direction, the first and second bit line wirings extending in a second direction perpendicular to the first direction and arranged side by side in a third direction perpendicular to the first direction and the second direction and the word line wirings extending in the third direction and arranged side by side in the second direction;
a first memory cell array having a plurality of first memory cells formed at intersections of the first bit line wirings and the word line wirings;
a second memory cell array having a plurality of second memory cells formed at intersections of the second bit line wirings and the word line wirings;

a plurality of first contacts extending in the first direction and electrically connected to the first bit line wirings in a hook-up region;

a plurality of second contacts extending in the first direction and electrically connected to the second bit line wirings in the hook-up region;

a plurality of first connection wirings and a plurality of second connection wirings, wherein the first connection wirings are electrically connected to the first contacts, respectively, and the second connection wirings are electrically connected to the second contacts, respectively, and separated from the first connection wirings, respectively, and wherein the first connection wirings have first ends connected to the first contacts and second ends that extend away from the first ends thereof in a first extension direction, and the second connection wirings have first ends connected to the second contacts and second ends that extend away from the first ends thereof in a second extension direction that is opposite to the first extension direction;

a first drive circuit region including a plurality of first drive circuits electrically connected to the first connection wirings, respectively; and a second drive circuit region including a plurality of second drive circuits electrically connected to the second connection wirings, respectively, wherein the word line wirings are between the first bit line wirings and the second bit line wirings.

11. The semiconductor storage device according to claim 10, wherein
the first contacts are electrically connected to the first ends of the first connection wirings, respectively, and the first drive circuits are electrically connected to the second ends of the first connection wirings, respectively, and
the second contacts are electrically connected to the first ends of the second connection wirings, respectively, and the second drive circuits are electrically connected to the second ends of the second connection wirings, respectively.

12. The semiconductor storage device according to claim 11, wherein
the first end of one of the first connection wirings and the first end of one of the second connection wirings are positioned between the second end of said one of the first connection wirings and the second end of said one of the second connection wirings, in the second direction.

13. The semiconductor storage device according to claim 12, wherein
a first group of the first connection wirings is provided in a first metal layer below the first bit line wirings in the first direction, and a second group of the first connection wirings is provided in a second metal layer below the first metal layer in the first direction, and
a first group of the second connection wirings is provided in the first metal layer, and a second group the second connection wirings is provided in the second metal layer.

14. The semiconductor storage device according to claim 12, wherein
each of the first drive circuit regions includes:
a first selection circuit configured to energize a corresponding one of the first bit line wirings to select a corresponding one of the first memory cells, and a first non-selection circuit configured to energize at least another one of the first wirings,
each of the second drive circuit regions includes:
a second selection circuit configured to energize a corresponding one of the second bit line wirings to select a corresponding one of the second memory cells, and
a second non-selection circuit configured to energize at least another one of the second bit line wirings,
the first selection circuit is disposed closer to the first contacts than the first non-selection circuit, and
the second selection circuit is disposed closer to the second contacts than the second non-selection circuit.

15. The semiconductor storage device according to claim 14, wherein
the hook-up region includes a first hook-up region and a second hook-up region respectively located on opposite sides of the first and second memory cell arrays,
the first connection wirings are electrically connected to the first contacts in the first hook-up region, and
the second connection wirings are electrically connected to the second contacts in the first hook-up region.

16. The semiconductor storage device according to claim 14, wherein the first non-selection circuit, the first selection circuit, the second selection circuit, and the second non-selection circuit are arranged in this order along the second direction.

17. The semiconductor storage device according to claim 14, further comprising:
third memory cell array disposed apart from the first and second memory cell arrays in the second direction, wherein
the first non-selection circuit is disposed below the first and second memory cell arrays,
the second non-selection circuit is disposed below the third memory cell array, and
the first selection circuit and the second selection circuit are provided between the first non-selection circuit and the second non-selection circuit in the second direction.

* * * * *

UNITED STATES PATENT AND TRADEMARK OFFICE
CERTIFICATE OF CORRECTION

| | |
|---|---|
| PATENT NO. | : 10,916,304 B2 |
| APPLICATION NO. | : 16/285121 |
| DATED | : February 9, 2021 |
| INVENTOR(S) | : Hiroyuki Hara |

It is certified that error appears in the above-identified patent and that said Letters Patent is hereby corrected as shown below:

On the Title Page

Item (54), and in the Specification Column 1 Line 4 insert --connected-- after "wirings".

Signed and Sealed this
Seventeenth Day of May, 2022

Katherine Kelly Vidal
*Director of the United States Patent and Trademark Office*